United States Patent
Schiele

(10) Patent No.: US 10,823,210 B2
(45) Date of Patent: Nov. 3, 2020

(54) SELF-LOCKING FRONT PANEL

(71) Applicant: Andrew Wireless Systems GmbH, Buchdorf (DE)

(72) Inventor: Dieter Schiele, Harburg (DE)

(73) Assignee: Andrew Wireless Systems GmbH, Buchdorf (DE)

( * ) Notice: Subject to any disclaimer, the term of this patent is extended or adjusted under 35 U.S.C. 154(b) by 0 days.

(21) Appl. No.: 15/900,640

(22) Filed: Feb. 20, 2018

(65) Prior Publication Data

US 2018/0335059 A1 Nov. 22, 2018

Related U.S. Application Data

(60) Provisional application No. 62/507,363, filed on May 17, 2017.

(51) Int. Cl.
*F16B 5/00* (2006.01)
*H05K 5/02* (2006.01)
(Continued)

(52) U.S. Cl.
CPC ............ *F16B 5/0016* (2013.01); *F16B 5/126* (2013.01); *H05K 5/0239* (2013.01); *F16B 5/0614* (2013.01); *F16B 2001/0092* (2013.01)

(58) Field of Classification Search
CPC .......... F16B 5/0016; F16B 5/126; F16B 2/22; F16B 5/0032; F16B 5/0614; F16B 5/0635; H05K 5/0239; H05K 5/03; H05K 5/0013; H05K 5/0221; H05K 5/0217; H05K 7/1488; H05K 7/12; G06F 1/181; H02G 3/0418;
(Continued)

(56) References Cited

U.S. PATENT DOCUMENTS 4,214,797 A * 7/1980 Borresen .................. G09F 7/00
312/257.1
4,907,767 A * 3/1990 Corsi ................... H02G 3/0418
138/162
(Continued)

FOREIGN PATENT DOCUMENTS

DE 102011016544 A1 * 10/2012 ........... H02G 3/0418

OTHER PUBLICATIONS

English translation of DE 102011016544-A1.*
(Continued)

*Primary Examiner* — Hiwot E Tefera
(74) *Attorney, Agent, or Firm* — Fogg & Powers LLC

(57) ABSTRACT

A self-locking front panel is provided that includes a base plate and first and second retaining members. The first retaining member extends from a back side of the base plate and terminates in a first retaining portion. The first retaining portion has a first rounded portion that bulges out in a direction of a first end edge of the base plate. The second retaining member also extends from the back side of the base plate a select distance from the first retaining member. The second retaining member terminates in a second retaining portion. The second retaining portion has a second rounded portion that bulges out in a direction of a second end edge of the base plate. The first and second retaining members are made of a resilient material that flexes under a load and returns to an original position when the load is removed. Other embodiments are disclosed.

13 Claims, 3 Drawing Sheets

(51) Int. Cl.
 *F16B 5/12* (2006.01)
 *F16B 5/06* (2006.01)
 *F16B 1/00* (2006.01)

(58) Field of Classification Search
 CPC .............. A47B 47/042; A47B 47/0075; A47B 2230/0096; A47B 47/0066
 USPC .............. 52/220.7, 287.1, 710, 718.04, 844; 312/223.2, 263, 265.6, 223.1, 321.5; 49/463
 See application file for complete search history.

(56) References Cited

U.S. PATENT DOCUMENTS

| | | | | |
|---|---|---|---|---|
| 4,942,271 A * | 7/1990 | Corsi | ................... | H02G 3/0418 138/162 |
| 5,134,250 A * | 7/1992 | Caveney | .............. | H02G 3/0418 138/162 |
| 5,199,776 A * | 4/1993 | Lin | .......................... | G06F 1/181 312/242 |
| 6,102,501 A * | 8/2000 | Chen | ....................... | G06F 1/181 312/223.2 |
| 6,234,593 B1 * | 5/2001 | Chen | ....................... | G06F 1/181 312/223.2 |
| 6,323,421 B1 * | 11/2001 | Pawson | ................ | H02G 3/0418 174/503 |
| 6,903,937 B2 * | 6/2005 | Watanabe | .............. | G11B 25/10 174/50 |
| 7,338,140 B1 * | 3/2008 | Huang | .................... | G06F 1/181 312/223.2 |
| 7,506,768 B2 * | 3/2009 | Rassmussen | ........ | H05K 7/1425 211/183 |
| 7,612,300 B2 * | 11/2009 | Owens | ................. | H02G 3/0437 174/480 |
| 7,948,745 B2 * | 5/2011 | Tang | ....................... | G06F 1/181 248/552 |
| 8,444,233 B2 * | 5/2013 | Xu | ....................... | H05K 5/0017 248/225.21 |
| 9,552,847 B2 * | 1/2017 | Lin | ...................... | H05K 9/0018 |
| 2003/0210529 A1 * | 11/2003 | Chen | ...................... | G06F 1/181 361/725 |
| 2004/0101356 A1 * | 5/2004 | Cheng | ................... | E05B 65/006 403/353 |
| 2006/0109618 A1 * | 5/2006 | Junkins | ................... | G06F 1/181 361/679.24 |
| 2007/0266671 A1 * | 11/2007 | Chromy | .................... | E04C 3/06 52/844 |
| 2008/0239646 A1 * | 10/2008 | Chen | ....................... | G06F 1/181 361/726 |
| 2008/0318631 A1 | 12/2008 | Baldwin et al. | | |
| 2009/0178985 A1 * | 7/2009 | Sempliner | ............ | H05K 7/1461 211/26 |
| 2010/0309613 A1 | 12/2010 | Zuo et al. | | |
| 2011/0116240 A1 * | 5/2011 | Wang | ................... | H05K 5/0239 361/728 |
| 2011/0149525 A1 | 6/2011 | Turner | | |
| 2012/0091090 A1 * | 4/2012 | Larsen | ................. | H02G 3/0418 211/184 |
| 2012/0156030 A1 * | 6/2012 | Shu | ......................... | G06F 1/183 415/213.1 |
| 2013/0309440 A1 | 11/2013 | Coulter | | |
| 2014/0016996 A1 * | 1/2014 | Chung | ................. | H05K 5/0013 403/321 |
| 2014/0186104 A1 * | 7/2014 | Hamberger | ......... | E04F 13/0894 403/292 |
| 2015/0163955 A1 * | 6/2015 | Larsen | ..................... | H05K 7/18 248/51 |
| 2018/0340332 A1 * | 11/2018 | Johnston | ............... | E04G 17/001 |

OTHER PUBLICATIONS

International Searching Authority, International Search Report and Written Opinion from PCT Application PCT/EP2018/062267 dated Jul. 18, 2018; From PCT Counterpart of U.S. Appl. No. 15/900,640; pp. 1-17; Published in WO.

* cited by examiner

SELF-LOCKING FRONT PANEL

CROSS-REFERENCE TO RELATED APPLICATIONS

This Application claims priority to U.S. Provisional Application Ser. No. 62/507,363, same title herewith, filed on May 17, 2017, which is incorporated in its entirety herein by reference.

BACKGROUND

Telecommunication and computing systems are often implemented using multiple components. One common way to house such components uses a rack in which removable sub-racks can be can be mounted or inserted. Each sub-rack can include a number of component bays in which component modules can be inserted. The sub-rack may include a common bus to share a common power source or to provide connections between component modules as well as external devices. One feature of sub-racks is that they are often designed so that the component modules can be easily replaced when not working properly. Another feature is that additional component modules may be added to unoccupied component bays in the sub-racks at a future date.

When a component bay in a sub-rack is unoccupied, it is common to attach a front panel to the sub-rack to block access to the unoccupied component bay. This may be for safety reasons or to prevent undesired elements from entering the unoccupied component bays of the sub-racks. In a typical configuration, the front panels are fastened to the sub-racks (depending on the size of the front panel) with two or more screws. A technician must remove the screws to remove the front panel to gain access to the unoccupied component bay and must attach the screws when attaching the front panel to the sub-rack in covering the unoccupied component bay.

SUMMARY

The following summary is made by way of example and not by way of limitation. It is merely provided to aid the reader in understanding some of the aspects of the subject matter described. Embodiments provide self-locking front panels to cover one or unoccupied bays of a component rack.

In one embodiment, a self-locking front panel is provided. The self-locking front panel includes a base plate and first and second retaining members. The base plate has a front side and an opposably positioned back side. The base plate further has a first end edge and an opposably positioned second end edge. The first retaining member extends from the back side of the base plate and terminates in a first retaining portion. The first retaining portion has a first rounded portion that bulges out in a direction of the first end edge of the base plate. The second retaining member also extends from the back side of the base plate a select distance from the first retaining member. The second retaining member terminates in a second retaining portion. The second retaining portion has a second rounded portion that bulges out in a direction of the second end edge of the base plate. The first and second retaining members are made of a resilient material that flexes under a load and returns to an original position when the load is removed.

In another example embodiment, another self-locking front panel is provided. The self-locking front panel in this embodiment includes a base plate, a first retaining member, a second retaining member and at least one guide tab. The base plate has a front side and an opposably positioned back side. The base plate further has a first end edge and an opposably positioned second end edge. The first retaining member extends from the back side of the base plate and terminates in a first retaining portion. The first retaining portion extends out beyond an edge of the first retaining member. The first retaining portion of the first retaining member is configured to be held within a first retaining groove of a first retaining rail of a housing of a component rack. The second retaining member extends from the back side of the base plate a select distance from the first retaining member. The second retaining member terminates in a second retaining portion. The second retaining portion extends out beyond an edge of the second retaining member. The second retaining portion of the second retaining member is configured to be held within a second retaining groove of a second retaining rail of the housing of the component rack to selectively couple the self-locking front panel to the component rack. The at least one guide tab extends from the back side of the base plate and is configured to guide the self-locking front panel to a desired position in relation to the component rack when covering at least one component bay of the component rack. At least the first and second retaining members are made of a resilient material that flexes under a load and returns to an original position when the load is removed.

In yet another embodiment, a component bay covering system for a component rack is provided. The system includes a housing, a first retaining rail, a second retaining rail and at least one self-locking front panel. The housing includes a front side with first front edge and a second front edge. The housing has at least one component bay accessed between the first front edge and the second front edge. The first retaining rail is positioned proximate the first front edge of the housing. The first retaining rail includes a first inner wall that is generally perpendicular to the first front edge of the housing. The first inner wall has at least one first retaining groove at a select location. The second retaining rail is positioned proximate the second front edge of the housing. The second retaining rail includes a second inner wall that is generally perpendicular to the second front edge of the housing. The second inner wall has at least one second retaining groove at a select location. The at least one self-locking front panel selectively covers the at least one component bay. The at least one self-locking front panel includes a base plate, a first retaining member and a second retaining member. The base plate has a front side and an opposably positioned back side. The base plate further has a first end edge and an opposably positioned second end edge. The first retaining member extends from the back side of the base plate and terminates in a first retaining portion. The first retaining portion has a first rounded portion bulging out to be received within the at least one first retaining groove of the first retaining rail when the at least one self-locking front panel is coupled to the housing. The second retaining member extends from the back side of the base plate a select distance from the first retaining member. The second retaining member terminates in a second retaining portion. The second retaining portion has a second rounded portion bulging out to be received within the at least one second retaining groove of the second retaining rail when the at least one self-locking front panel is coupled to the housing. The first and second retaining members are made of a resilient material that flexes under a load and returns to an original position when the load is removed.

BRIEF DESCRIPTION OF THE DRAWINGS

In accordance with common practice, the various described features are not drawn to scale but are drawn to emphasize specific features relevant to the subject matter described. Reference characters denote like elements throughout Figures and text.

DETAILED DESCRIPTION

In the following detailed description, reference is made to the accompanying drawings, which form a part hereof, and in which is shown by way of illustration specific embodiments in which the inventions may be practiced. These embodiments are described in sufficient detail to enable those skilled in the art to practice the invention, and it is to be understood that other embodiments may be utilized and that changes may be made without departing from the spirit and scope of the present invention. The following detailed description is, therefore, not to be taken in a limiting sense, and the scope of the present invention is defined only by the claims and equivalents thereof.

Figure 1:
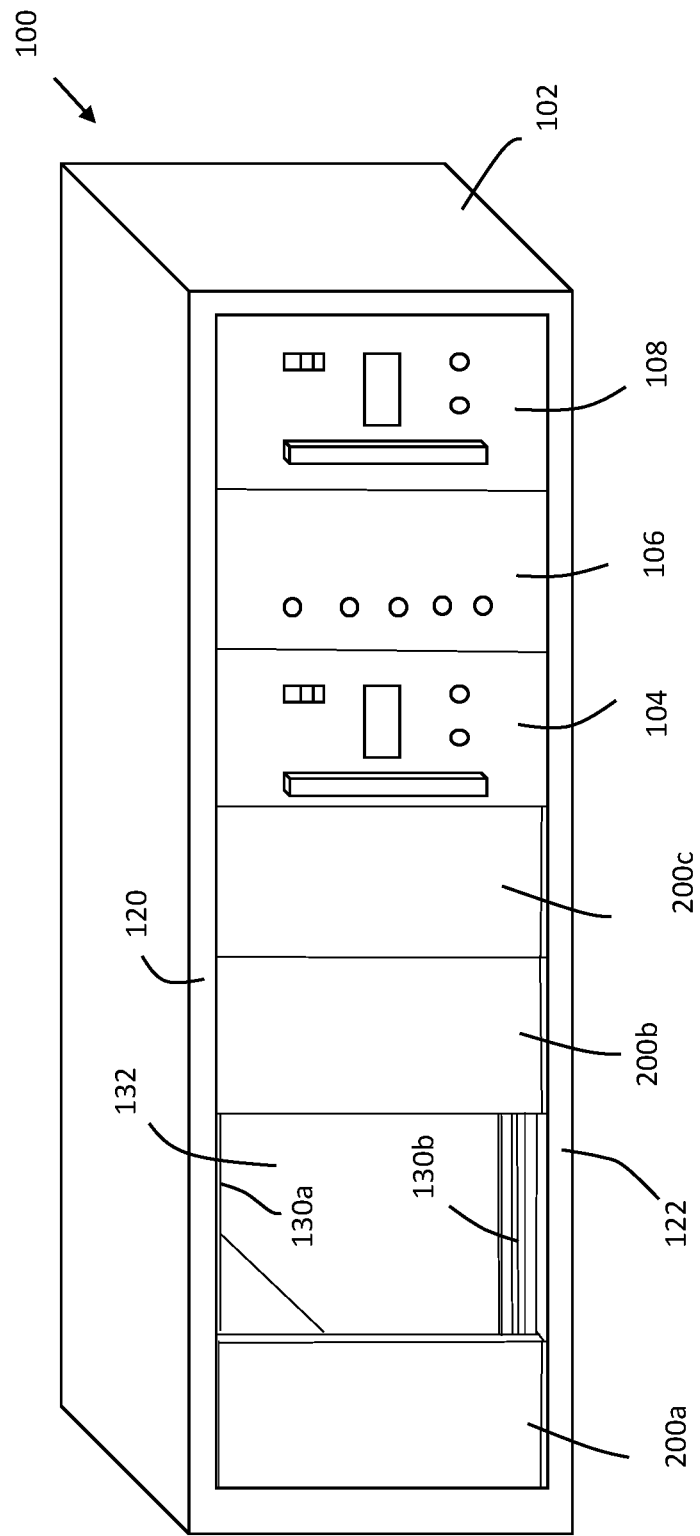
FIG. 1 is front perspective view of a component rack including a plurality self-locking front panels according to one exemplary embodiment.

Embodiments provide self-locking front panels that are used to selectively cover unoccupied component bays in component racks. In embodiments, the self-locking front panels are easily installed and removed without the use of a tool. Referring to FIG. 1, a component rack 100 (which may be sub-rack) of an embodiment is illustrated. The component rack 100 includes a housing 102 with a plurality of component bays 132. In this example, only one component bay 132 is shown as being open and unoccupied. The other component bays are occupied by component modules 104, 106, 108 or are covered by self-locking front panels 200a, 200b and 200c. In an embodiment, the housing 102 includes a first retaining rail 130a and a second retaining rail 130b. In this example embodiment, the first retaining rail 130a is positioned proximate an upper front edge 120 of the housing 102 and the second retaining rail 130b is positioned proximate a lower front edge 122 of the housing 102. In other configurations, the first and second retaining rails 130a and 130b may be positioned proximate opposing front side edges. The opposing first and second retaining rails 130a and 130b are used to selectively hold the self-locking front panels, hereinafter generally designated as 200.

Figure 2:
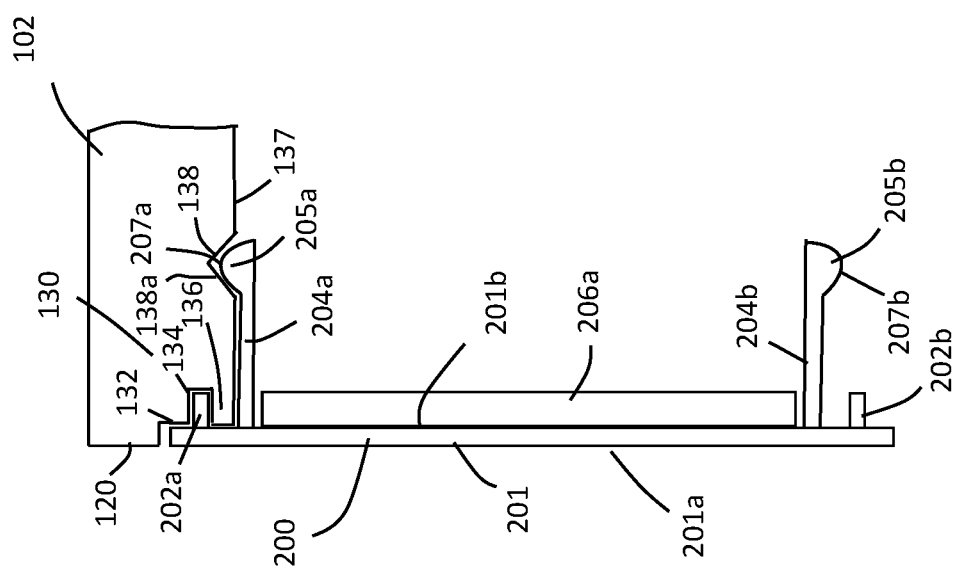
FIG. 2 is partial side cross-section view of a housing of the component rack and a self-locking front panel according to one exemplary embodiment.

Referring to FIG. 2, a partial cross-sectional side view of the housing 102 including a retaining rail, generally designated as 130, holding a portion of a self-locking front panel 200 of an embodiment is illustrated. The retaining rail 130 represents both the first retaining rail 130a and the second retaining rail 130b since, in at least one embodiment, the second retaining rail 130b is a mirror image of the first retaining rail 130a. FIG. 2 illustrates how the self-locking front panel 200 is held by a retaining rail 130. The retaining rail 130, in an embodiment may be formed proximate a front edge 120 of the housing 102. In another embodiment, the retaining rail 130 is attached to the housing 102 proximate the front edge 120 of the housing 102. The retaining rail 130, in this example embodiment, includes a recessed ledge 132 that is recessed a select distance in from the front edge 120 of the housing 102. The recessed ledge 132 may have a surface that is generally parallel to a surface of the front edge 103 of the housing 102. In an embodiment, the depth of the recess is approximately equal to the thickness of a base plate 201 of the locking panel 200 such that the self-locking front panel 200 sits flush with the front edge 120 of the housing 102 when the self-locking front panel 200 is attached to the housing 102. The retaining rail 130 further includes a guide holding slot 134 within the recessed ledge 132. The guide holding slot 134 extends inward from the recessed ledge 132 a select distance. In one embodiment, the select distance is equal to or slightly greater than a length of a holding tab 202a of the self-locking front panel 200 which is discussed in detail below. An inner wall 137 of the retaining rail 130 extends generally perpendicular from the recessed ledge 132. The inner wall 137 is a select distance from the guide holding slot 134. Moreover, a retaining groove 138 is formed in the inner wall 137 a select distance in from the recessed ledge 132.

Figure 3:
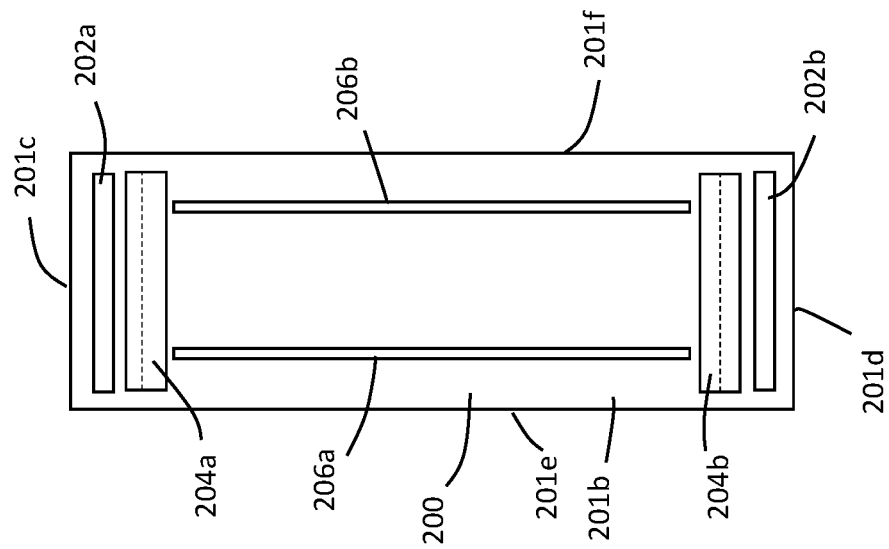
FIG. 3 is a back view of a self-locking front panel according to one exemplary embodiment.

The self-locking front panel 200 is further illustrated in detail in FIGS. 2 and 3. The self-locking front panel 200 includes a base plate 201 having a front side 201a and a back side 201b. The base plate 201 further includes a first end edge 201c and an opposably positioned second end edge 201d. The base plate 201 also includes a first side edge 201e and an opposably positioned second side edge 201f. Extending from the back side 201b of the base plate 201 is a first guide tab 202a and a second guide tab 202b. The first guide tab 202a is an elongated member that is positioned proximate the first end edge 201c of the base plate 201. The first guide tab 202a further extends proximately between the first side edge 201e to the second side edge 201f of the base plate 201. Similarly, the second guide tab 202b is an elongated member that is positioned proximate the second end edge 201d of the base plate 201. The second guide tab 202b also extends proximately between the first side edge 201e to the second side edge 201f of the base plate 201.

A spaced distance from the first guide tab 202a is a first retaining member 204a that extends from the back side 201b of the base plate 201 in a parallel fashion to the first guide tab 202a. The first retaining member 204a terminates in a retaining portion 205a that includes a first rounded portion 207a that bulges out from an edge of the first retaining member 204a in a direction towards the first guide tab 202a and the first end edge 201c. The first retaining member 204a is an elongated member that extends proximately between the first side edge 201e to the second side edge 201f of the base plate 201. Similarly, a spaced distance from the second guide tab 202b is a second retaining member 204b that extends from the back side 201b of the base plate 201 in a parallel fashion to the second guide tab 202b. The second retaining member 204b terminates in a retaining portion 205b that includes a second round portion 207b that bulges out beyond and edge of the second retaining member 204b in a direction towards the second holding tab 202b and the second end edge 201c. The second retaining member 204b is an elongated member that extends proximately between the first side edge 201e to the second side edge 201f of the base plate 201. Positioned between the first retaining member 204a and the second retaining member 204a is a pair of spaced stabilizing fins 206a and 206b. The stabilizing fins 206a and 206b extend from the back side 201b of the base plate in a parallel fashion. Moreover the spaced parallel stabilizing fins 206a and 206b are elongated members that traverse the back side 201b of the base plate 201 in a perpendicular fashion in relation to the first and second retaining members 204a and 204b. The stabilizing fins 206a and 206b along with guide tabs 202a and 202b and retaining members 204a and 240b help stabilize the base plate 201.

In use, the rounded portions of the retaining portions 205a and 205b of the respective first and second retaining members 204a and 204b of the self-locking front panel 200 are received in retaining grooves 138 of the first and second retaining rails 130a and 130b of the housing 102 to selectively lock the self-locking front panel 200 to the housing 120. The rounded portion 207a of retaining portion 205a of the first retaining member 204a is received in the retaining groove 138 of the first retaining rail is illustrated in FIG. 2. As also illustrated, when connected, the first guide tab 202a is received in the guide slot 134 of the first retaining rail 130a. A similar arrangement of the rounded portion 207b of the retaining portion 205b of the second retaining member 204b of the self-locking front panel 200 is received in a retaining groove of the second retaining rail 130b and the second guide tab 202b of the self-locking front panel 200 is received within a guide slot of the second retaining rail 103b. Since, the self-locking front panel 200 has the same attaching arrangement proximate its ends and the retaining rails 130 have the same attaching arrangement in an embodiment, is does not matter which end of the self-locking front panel 200 is attached to the first and second retaining rails 130a and 130b.

In an embodiment, the self-locking front panels 200 are made from a resilient material, such as but not limited to, a plastic that allows for flexing under a load without breaking while returning to its original shape once a load is released. In use, to install a self-locking front panel 200, a technician simply aligns the first guide tab 202a and the second guide tab 202b with the guide holding slot 134 of the respective first and second retaining rails 130a and 130b and pushes the self-locking front panel 200 into the housing 102 to cover a component bay 132. The force by the technician on the self-locking front panel 200 causes the rounded portion 207a retaining portion 205a of the retaining member 204b to engage a finger portion 136 of the first retaining rail 130a positioned between the holding slot 134 and the inner wall 137 of the first retaining rail 130a. The rounded portion 207a of the retaining portion 205a guides the retaining member 204a to bend therein allowing the retaining portion 205a to slide along the inner wall 137 as the technician pushes the self-locking front panel 200 into the housing 102. Once the bulging rounded portion 207a of the retaining portion 205a reaches the retaining groove 138 in the inner wall 137, energy created by the initial bend of the resilient material stored in the retaining member 204a forces the rounded portion 207a of the retaining portion 205a of the retaining member 204a into the retaining groove 138 of the first retaining rail 130a therein locking the self-locking front panel 200 to the housing 102. The same thing occurs with the rounded portion 207b of the retaining portion 205b of retaining member 204b and a retaining groove in the second retaining rail 130b. Hence, no tool is needed to cover a bay 132 of a component rack 100.

In removing a self-locking front panel 200, the technician simply has to push on a central portion of the front side 201b of the base plate 201 of the self-locking front panel 200. This bends base plate 201 therein allowing the technician to grab an edge 210c, 201d, 201e or 201f of the base plate 201. Since the rounded portions 207a and 207b of the retaining portions 205a and 205b of the respective retaining members 204a and 204b are rounded, a gentle tug by the technician removes the retaining portions 205a and 205b from the retaining grooves 138 of the respective first and second retaining rails 130a and 130b. In the embodiment illustrated in FIG. 2, the retaining groove 138 includes a ramp surface 138s to aid in the removal of the respective retaining portion 205a and 205b of the retaining members 240a and 204b of the self-locking front panel from the retaining groove 138. Moreover, often two self-locking front panels 200 will be positioned next to each other. In this situation, the technician can remove one of the self-locking front panels 200 by centrally pushing on the other self-locking front panel 200 to reach an edge 201e or 201f of the self-locking front panel 200 to be removed. The technician can then simply grab the edge 201e or 210f of the base plate 201 of the self-locking front panel 200 to be removed and pull it out. The self-locking front panel 200 can be any size that is needed to cover one or more component bays 132 of the component rack 100.

Figure 4:
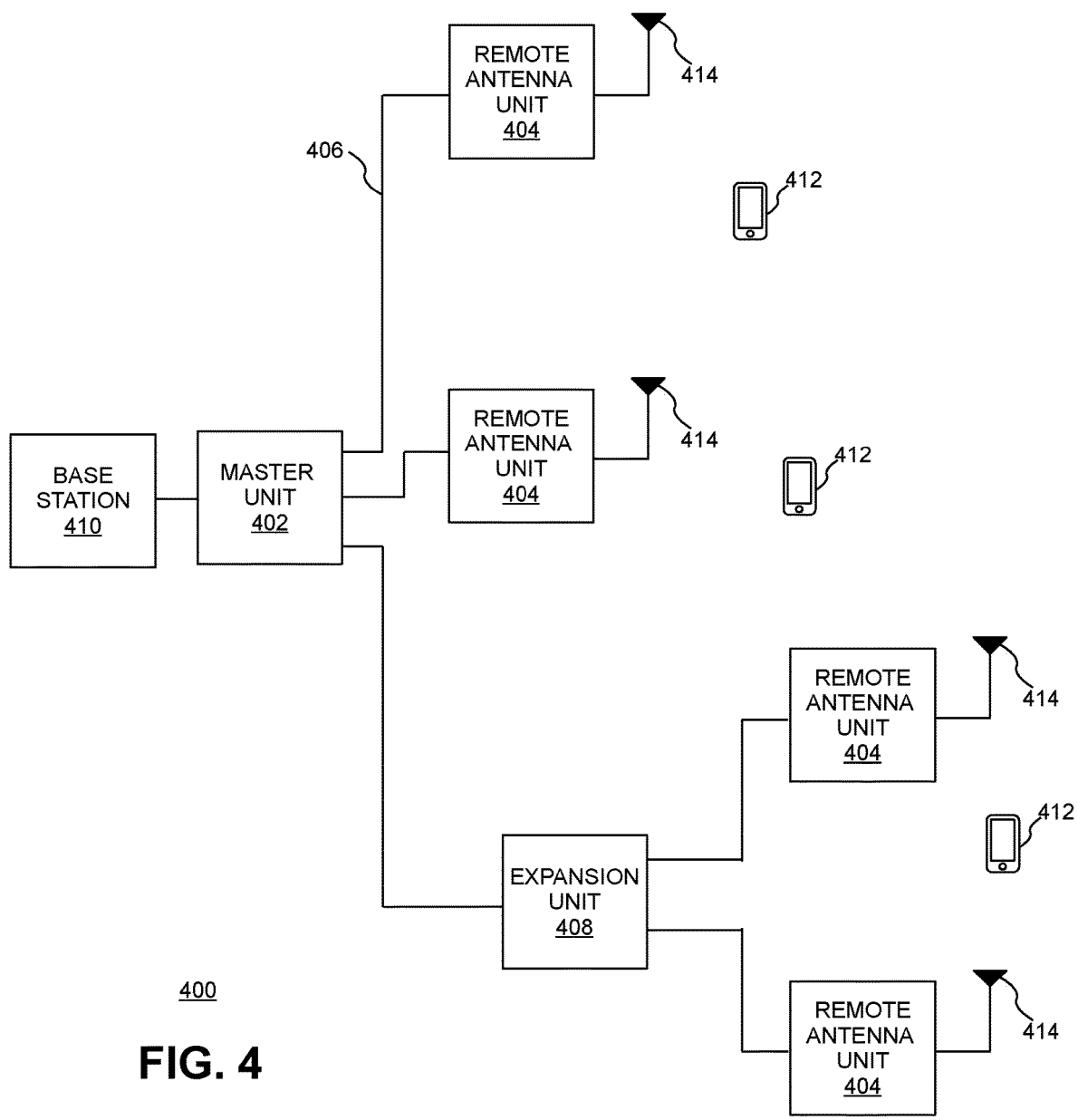
FIG. 4 is a block diagram of one exemplary embodiment of a distributed antenna system (DAS) in which a self-locking front panel can be used.

The self-locking front panel described here can be used with various types of rack-mounted equipment. In one example illustrated in FIG. 4, the self-locking front panel described here is used with a distributed antenna system (DAS) 400.

The DAS 400 comprises one or more master units 402 that are communicatively coupled to one or more remote antenna units 404 via one or more cables 406. Each remote antenna unit 404 can be communicatively coupled directly to one or more of the master units 402 or indirectly via one or more other remote antenna units 404 and/or via one or more expansion (or other intermediary) unit 408.

Each master unit 404 is communicatively coupled to one or more base stations 410. One or more of the base stations 410 can be co-located with the respective master units 404 to which they are coupled (for example, where each base station 310 is dedicated to providing base station capacity to the system 300 and is coupled to the respective master units 302). Also, one or more of the base stations 310 can be located remotely from the respective master units 302 to which it is coupled (for example, where the base station 310 provides base station capacity to an area beyond the coverage area of the DAS 300). In this latter case, the master unit 302 can be coupled to a donor antenna and repeater or bi-directional amplifier in order to wirelessly communicate with the remotely located base station 310.

The base stations 410 can also be coupled to the master units 402 using a network of attenuators, combiners, splitters, amplifiers, filters, cross-connects, etc., (sometimes referred to collectively as a "point-of-interface" or "POI"). This network can be included in the master units 402 and/or can be separate from the master units 402. This is done so that, in the downlink, the desired set of RF channels output by the base stations 410 can be extracted, combined, and routed to the appropriate master units 402, and so that, in the upstream, the desired set of carriers output by the master units 402 can be extracted, combined, and routed to the appropriate interface of each base station 410. It is to be understood, however, that this is one example and that other embodiments can be implemented in other ways.

In general, each master unit 402 comprises downlink DAS circuitry that is configured to receive one or more downlink signals from one or more base stations 410. Each base station downlink signal includes one or more radio frequency channels used for communicating in the downlink direction with user equipment 412 over the relevant wireless air interface. Typically, each base station downlink signal is received as an analog radio frequency signal, though in some embodiments one or more of the base station signals are received in a digital form (for example, in a digital baseband form complying with the Common Public Radio Interface ("CPRI") protocol, Open Radio Equipment Interface ("ORI") protocol, the Open Base Station Standard Initiative ("OBSAI") protocol, or other protocol).

The downlink DAS circuitry in each master unit 402 is also configured to generate one or more downlink transport signals derived from one or more base station downlink signals and to transmit one or more downlink transport signals to one or more of the remote antenna units 404.

Each remote antenna unit 404 comprises downlink DAS circuitry that is configured to receive the downlink transport signals transmitted to it from one or more master units 402 and to use the received downlink transport signals to generate one or more downlink radio frequency signals that are radiated from one or more coverage antennas 414 associated with that remote antenna unit 404 for reception by user equipment 412. In this way, the DAS 400 increases the coverage area for the downlink capacity provided by the base stations 410.

Also, each remote antenna unit 404 comprises uplink DAS circuitry that is configured to receive one or more uplink radio frequency signals transmitted from the user equipment 412. These signals are analog radio frequency signals.

The uplink DAS circuitry in each remote antenna unit 404 is also configured to generate one or more uplink transport signals derived from the one or more remote uplink radio frequency signals and to transmit one or more uplink transport signals to one or more of the master units 402.

Each master unit 402 comprises uplink DAS circuitry that is configured to receive the respective uplink transport signals transmitted to it from one or more remote antenna units 404 and to use the received uplink transport signals to generate one or more base station uplink radio frequency signals that are provided to the one or more base stations 410 associated with that master unit 402. Typically, this involves, among other things, combining or summing uplink signals received from multiple remote antenna units 404 in order to produce the base station signal provided to each base station 410. In this way, the DAS 400 increases the coverage area for the uplink capacity provided by the base stations 410.

Each expansion unit 408 comprises downlink DAS circuitry that is configured to receive the downlink transport signals transmitted to it from the master unit 402 (or other expansion unit 408) and transmits the downlink transport signals to one or more remote antenna units 404 or other downstream expansion units 408. Each expansion unit 408 also comprises uplink DAS circuitry that is configured to receive the respective uplink transport signals transmitted to it from one or more remote antenna units 404 or other downstream expansion units 408, combine or sum the received uplink transport signals, and transmit the combined uplink transport signals upstream to the master unit 402 or other expansion unit 408.

In other embodiments, one or more remote antenna units 404 are coupled to one or more master units 402 via one or more other remote antenna units 404 (for examples, where the remote antenna units 404 are coupled together in a daisy chain or ring topology).

The downlink DAS circuitry and uplink DAS circuitry in each master unit 402, remote antenna unit 404, and expansion unit 408, respectively, can comprise one or more appropriate connectors, attenuators, combiners, splitters, amplifiers, filters, duplexers, analog-to-digital converters, digital-to-analog converters, electrical-to-optical converters, optical-to-electrical converters, mixers, field-programmable gate arrays (FPGAs), microprocessors, transceivers, framers, etc., to implement the features described above. Also, the downlink DAS circuitry and uplink DAS circuitry may share common circuitry and/or components.

The DAS 400 can use digital transport, analog transport, or combinations of digital and analog transport for generating and communicating the transport signals between the master units 402, the remote antenna units 404, and any expansion units 408.

In such a DAS embodiment, one or more of the master unit 402, the remote antenna unit 404, or the expansion unit 408 can be implemented at least in part using components that are mounted in a rack or sub-rack as described above in connection with FIGS. 1 and 2. The self-locking panel described above can be used with such embodiments.

The self-locking front panel described here can be used with other types of rack-mounted equipment.

Example Embodiments

Example 1 includes a self-locking front panel. The self-locking front panel includes a base plate and first and second retaining members. The base plate has a front side and an opposably positioned back side. The base plate further has a first end edge and an opposably positioned second end edge. The first retaining member extends from the back side of the base plate and terminates in a first retaining portion. The first retaining portion has a first rounded portion that bulges out in a direction of the first end edge of the base plate. The second retaining member also extends from the back side of the base plate a select distance from the first retaining member. The second retaining member terminates in a second retaining portion. The second retaining portion has a second rounded portion that bulges out in a direction of the second end edge of the base plate. The first and second retaining members are made of a resilient material that flexes under a load and returns to an original position when the load is removed.

Example 2 includes the self-locking front panel of Example 1, wherein the first retaining member further extends proximately between a first side edge to a second side edge of the base plate and the second retaining member further extends proximately between the first side edge to the second side edge of the base plate.

Example 3 includes the self-locking front panel of any of Examples 1-2, further including a first guide tab that extends from the back side of the base plate between the first end edge of the base plate and the first retaining member. The first guide tab further extends proximately between a first side edge to a second side edge of the base plate. A second guide tab extends from the back side of the base plate between the second end edge of the base plate and the second retaining member. The second guide tab further extends proximately between a first side edge to a second side edge of the base plate.

Example 4 includes the self-locking front panel of any of Examples 1-3, further including at least one stabilizing fin extending from the back side of the base plate configured to stabilize the base plate.

Example 5 includes the self-locking front panel of Example 4, wherein the at least one stabilizing fin extends proximately between the first retaining member and the second retaining member.

Example 6 includes the self-locking front panel of any of Examples 4-5, wherein the at least one stabilizing fin further includes a first stabilizing fin and a second stabilizing fin that is spaced a select distance from the first stabilizing fin.

Example 7 includes a self-locking front panel for a component rack. The self-locking front panel in this Example includes a base plate, a first retaining member, a second retaining member and at least one guide tab. The base plate has a front side and an opposably positioned back side. The base plate further has a first end edge and an opposably positioned second end edge. The first retaining member extends from the back side of the base plate and terminates in a first retaining portion. The first retaining portion extends out beyond an edge of the first retaining member. The first retaining portion of the first retaining member is configured to be held within a first retaining groove of a first retaining rail of a housing of a component rack. The second retaining member extends from the back side of the base plate a select distance from the first retaining member. The second retaining member terminates in a second retaining portion. The second retaining portion extends out beyond an edge of the second retaining member. The second retaining portion of the second retaining member is configured to be held within a second retaining groove of a second retaining rail of the housing of the component rack to selectively couple the self-locking front panel to the component rack. The at least one guide tab extends from the back side of the base plate and is configured to guide the self-locking front panel to a desired position in relation to the component rack when covering at least one component bay of the component rack. At least the first and second retaining members are made of a resilient material that flexes under a load and returns to an original position when the load is removed.

Example 8 includes the self-locking front panel of Example 7, wherein the at least one guide tab further includes a first guide tab that extends from the back side of the base plate between the first end edge of the base plate and the first retaining member. The first guide tab further extends proximately between a first side edge to a second side edge of the base plate. The first guide tab is configured to be received in a guide holding slot of the first retaining rail. A second guide tab extends from the back side of the base plate between the second end edge of the base plate and the second retaining member. The second guide tab further extends proximately between a first side edge to a second side edge of the base plate. The second guide tab is configured to be received in a guide holding slot of the first retaining rail.

Example 9 includes the self-locking front panel of any of Examples 7-8, wherein the first retaining portion of the first retaining member includes a first rounded portion. The first rounded portion bulges out in the direction of the first end edge of the base plate. The first rounded portion is configured to be held within the first retaining groove of the first retaining rail of the housing of the component rack. The second retaining portion of the second retaining member includes a second rounded portion that bulges out in a direction of the second end edge of the base plate. The second rounded portion is configured to be held within the second retaining groove of the second retaining rail of the housing of the component rack.

Example 10 includes the self-locking front panel of any of Examples 7-9, wherein the first retaining member further extends proximately between a first side edge to a second side edge of the base plate and the second retaining member further extends proximately between the first side edge to the second side edge of the base plate.

Example 11 includes the self-locking front panel of any of Examples 7-10, further including at least one stabilizing fin extending from the back side of the base plate that is configured to stabilize the base plate.

Example 12 includes a component bay covering system for a component rack. The system includes a housing, a first retaining rail, a second retaining rail and at least one self-locking front panel. The housing includes a front side with first front edge and a second front edge. The housing has at least one component bay accessed between the first front edge and the second front edge. The first retaining rail is positioned proximate the first front edge of the housing. The first retaining rail includes a first inner wall that is generally perpendicular to the first front edge of the housing. The first inner wall has at least one first retaining groove at a select location. The second retaining rail is positioned proximate the second front edge of the housing. The second retaining rail includes a second inner wall that is generally perpendicular to the second front edge of the housing. The second inner wall has at least one second retaining groove at a select location. The at least one self-locking front panel selectively covers the at least one component bay. The at least one self-locking front panel includes a base plate, a first retaining member and a second retaining member. The base plate has a front side and an opposably positioned back side. The base plate further has a first end edge and an opposably positioned second end edge. The first retaining member extends from the back side of the base plate and terminates in a first retaining portion. The first retaining portion has a first rounded portion bulging out to be received within the at least one first retaining groove of the first retaining rail when the at least one self-locking front panel is coupled to the housing. The second retaining member extends from the back side of the base plate a select distance from the first retaining member. The second retaining member terminates in a second retaining portion. The second retaining portion has a second rounded portion bulging out to be received within the at least one second retaining groove of the second retaining rail when the at least one self-locking front panel is coupled to the housing. The first and second retaining members are made of a resilient material that flexes under a load and returns to an original position when the load is removed.

Example 13 includes the system of Example 12, wherein the first retaining rail includes a first recessed ledge that has a first surface that is generally parallel with a first surface of the first front edge. The first recessed ledge extends between the first front ledge and the first inner wall of the first retaining rail. A first portion of the backside of the base plate of the at least one self-locking front panel proximate the first end edge of the base plate abuts the first recessed ledge when the at least one self-locking front panel is coupled to the housing. The second retaining rail includes a second recessed ledge that has a second surface that is generally parallel with a second surface of the second front edge. The second recessed ledge extends between the second front ledge and the second inner wall of the second retaining rail. A second portion of the backside of the base plate of the at least one self-locking front panel proximate the second end edge of the base plate abuts the second recessed ledge when the at least one self-locking front panel is coupled to the housing.

Example 14 includes the system of Example 13, wherein a thickness of the base plate of the at least one self-locking front panel is generally the same as a first recess distance between the first front edge and the first recessed ledge and a second recess distance between the second front edge and the second recessed ledge.

Example 15 includes the system of any of Examples 12-14, further including a first guide tab that extends from the back side of the base plate between the first end edge of the base plate and the first retaining member. The first guide tab further extends proximately between a first side edge to a second side edge of the base plate. The first retaining rail has a first guide holding slot. The first guide tab is received within the first guide holding slot when the at least one self-locking front panel is coupled to the housing. A second guide tab extends from the back side of the base plate between the second end edge of the base plate and the second retaining member. The second guide tab further extends proximately between a first side edge to a second side edge of the base plate. The second retaining rail has a second guide holding slot. The second guide tab is received within the second guide holding slot when the at least one self-locking front panel is coupled to the housing.

Example 16 includes the system of Example 15, wherein the first retaining rail includes a first recessed ledge having a first surface that is generally parallel with a first surface of the first front edge. The first guide holding slot extends into the first recessed ledge. The second retaining rail includes a second recessed ledge that has a second surface that is generally parallel with a second surface of the second front edge. The second guide holding slot extends into the second recessed ledge.

Example 17 includes the system of any of Examples 12-16, wherein the at least one first retaining groove of the first retaining rail has at least one ramp surface to help the first rounded portion of the first retaining member out of the at least one first retaining groove. Moreover, the at least one second retaining groove of the first retaining rail has at least one ramp surface to help the second rounded portion of the second retaining member out of the at least one second retaining groove.

Example 18 includes the system of any of Examples 12-17, wherein the self-locking front panel is formed from a resilient material that flexes under a load and returns to an original position when the load is removed Example 19 includes the system of any of Examples 12-18, further including at least one stabilizing fin extending from the back side of the base plate of the self-locking front panel proximately between the first retaining member and the second retaining member. The at least one stabilizing fin configured to stabilize the base plate.

Example 20 includes the system of any of Examples 12-19, wherein the component rack is part of a distributed antenna system.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

The invention claimed is:

1. A self-locking front panel for a component rack, the self-locking front panel comprising:
    a base plate having a front side and an opposably positioned back side, the base plate further having a first end edge and an opposably positioned second end edge;
    a first retaining member extending from the back side of the base plate, the first retaining member terminating in a first retaining portion, the first retaining portion extending out beyond an edge of the first retaining member, the first retaining portion of the first retaining member configured to be held within a first retaining groove of a first retaining rail of a housing of a component rack;
    a second retaining member extending from the back side of the base plate a select distance from the first retaining member, the second retaining member terminating in a second retaining portion, the second retaining portion extending out beyond an edge of second retaining member, the second retaining portion of the second retaining member configured to be held within a second retaining groove of a second retaining rail of the housing of the component rack to selectively couple the self-locking front panel to the component rack;
    at least one guide tab extending from the back side of the base plate configured to guide the self-locking front panel to a desired position in relation to the component rack when covering at least one component bay, the at least one guide tab being an elongated member extending proximately between a first side edge to a second side edge of the base plate in a parallel fashion with at least one of the first and second retaining members and positioned between an end edge of the base plate and the associated one of the first and second retaining members, the at least one guide tab configured to be received in an associated guide holding slot of an associated one of the first and second retaining rails of the housing such that a finger portion of the associated one of the first and second retaining rail is positioned between the at least one guide tab and an associated one of the first and second retaining member that engages the finger portion of the associated one of the first and second retaining rail when the self-locking front panel is coupled to the housing; and
    at least the first and second retaining members being made of a resilient material that flexes under a load and returns to an original position when the load is removed.

2. The self-locking front panel of claim 1, wherein the at least one guide tab further comprises:
    a first guide tab extending from the back side of the base plate between the first end edge of the base plate and the first retaining member, the first guide tab configured to be received in the guide holding slot of the first retaining rail; and
    a second guide tab extending from the back side of the base plate between the second end edge of the base plate and the second retaining member, the second guide tab configured to be received in the guide holding slot of the second retaining rail.

3. The self-locking front panel of claim 1, wherein:
    the first retaining portion of the first retaining member includes a first rounded portion, the first rounded portion bulging out in the direction of the first end edge of the base plate, the first rounded portion configured to be held within the first retaining groove of the first retaining rail of the housing of the component rack; and
    the second retaining portion of the second retaining member includes a second rounded portion bulging out in a direction of the second end edge of the base plate, the second rounded portion configured to be held within the second retaining groove of the second retaining rail of the housing of the component rack.

4. The self-locking front panel of claim 1, wherein:
    the first retaining member further extends proximately between the first side edge to the second side edge of the base plate; and the second retaining member further extends proximately between the first side edge to the second side edge of the base plate.

5. The self-locking front panel of claim 1, further comprising:
at least one stabilizing fin extending from the back side of the base plate configured to stabilize the base plate.

6. A component bay covering system for a component rack, the system comprising:
a housing including front side with first front edge and a second front edge, the housing having at least one component bay accessed between the first front edge and the second front edge;
a first retaining rail positioned proximate the first front edge of the housing, the first retaining rail including a first inner wall generally perpendicular to the first front edge of the housing, the first inner wall having at least one first retaining groove at a select location, the first retaining rail further including a first recessed ledge, the first recessed ledge of the first retaining rail having a first surface that is generally parallel with a first surface of the first front edge, the first recessed ledge extending between the first front edge and the first inner wall of the first retaining rail;
a second retaining rail positioned proximate the second front edge of the housing, the second retaining rail including second inner wall generally perpendicular to the second front edge of the housing, the second inner wall having at least one second retaining groove at a select location, the second retaining rail further including a second recessed ledge, the second recessed ledge of the second retaining rail having a second surface that is generally parallel with a second surface of the second front edge, the second recessed ledge extending between the second front edge and the second inner wall of the second retaining rail; and
at least one self-locking front panel to selectively cover the at least one component bay, the at least one self-locking front panel including,
a base plate having a front side and an opposably positioned back side, the base plate further having a first end edge and an opposably positioned second end edge, a first portion of the backside of the base plate of the at least one self-locking front panel proximate the first end edge of the base plate abutting the first recessed ledge when the at least one self-locking front panel is coupled to the housing, a second portion of the backside of the base plate of the at least one self-locking front panel proximate the second end edge of the base plate abutting the second recessed ledge when the at least one self-locking front panel is coupled to the housing,
a first retaining member extending from the back side of the base plate, the first retaining member terminating in a first retaining portion, the first retaining portion having a first rounded bulging portion to be received within the at least one first retaining groove of the first retaining rail when the at least one self-locking front panel is coupled to the housing,
a second retaining member extending from the back side of the base plate a select distance from the first retaining member, the second retaining member terminating in a second retaining portion, the second retaining portion having a second rounded bulging portion to be received within the at least one second retaining groove of the second retaining rail when the at least one self-locking front panel is coupled to the housing, and
the first and second retaining members being made of a resilient material that flexes under a load and returns to an original position when the load is removed.

7. The system of claim 6, wherein a thickness of the base plate of the at least one self-locking front panel is generally the same as a first recess distance between the first front edge and the first recessed ledge and a second recess distance between the second front edge and the second recessed ledge.

8. The system of claim 6, wherein:
the at least one first retaining groove of the first retaining rail has at least one ramp surface to help the first rounded portion of the first retaining member out of the at least one first retaining groove; and
the at least one second retaining groove of the first retaining rail has at least one ramp surface to help the second rounded portion of the second retaining member out of the at least one second retaining groove.

9. The system of claim 6, wherein the self-locking front panel is formed from a resilient material that flexes under a load and returns to an original position when the load is removed.

10. The system of claim 6, further comprising:
at least one stabilizing fin extending from the back side of the base plate of the self-locking front panel proximately between the first retaining member and the second retaining member, the at least one stabilizing fin configured to stabilize the base plate.

11. The system of claim 6, wherein:
the component rack is part of a distributed antenna system.

12. A component bay covering system for a component rack, the system comprising:
a housing including front side with first front edge and a second front edge, the housing having at least one component bay accessed between the first front edge and the second front edge;
a first retaining rail positioned proximate the first front edge of the housing, the first retaining rail including a first inner wall generally perpendicular to the first front edge of the housing, the first inner wall having at least one first retaining groove at a select location;
a second retaining rail positioned proximate the second front edge of the housing, the second retaining rail including second inner wall generally perpendicular to the second front edge of the housing, the second inner wall having at least one second retaining groove at a select location;
at least one self-locking front panel to selectively cover the at least one component bay, the at least one self-locking front panel including,
a base plate having a front side and an opposably positioned back side, the base plate further having a first end edge and an opposably positioned second end edge,
a first retaining member extending from the back side of the base plate, the first retaining member terminating in a first retaining portion, the first retaining portion having a first rounded bulging portion to be received within the at least one first retaining groove of the first retaining rail when the at least one self-locking front panel is coupled to the housing, a second retaining member extending from the back side of the base plate a select distance from the first retaining member, the second retaining member terminating in a second retaining portion, the second retaining portion having a second rounded bulging portion to be received within the at least one second retaining groove of the second retaining rail when the at least one self-locking front panel is coupled to the housing, and the first and second retaining members being made of a resilient material that flexes under a load and returns to an original position when the load is removed;

a first guide tab extending from the back side of the base plate between the first end edge of the base plate and the first retaining member, the first guide tab further extending proximately between a first side edge to a second side edge of the base plate;

the first retaining rail having a first guide holding slot, the first guide tab received within the first guide holding slot when the at least one self-locking front panel is coupled to the housing;

a second guide tab extending from the back side of the base plate between the second end edge of the base plate and the second retaining member, the second guide tab further extending proximately between a first side edge to a second side edge of the base plate; and the second retaining rail having a second guide holding slot, the second guide tab received within the second guide holding slot when the at least one self-locking front panel is coupled to the housing.

13. The system of claim 12, wherein:

the first retaining rail includes a first recessed ledge having a first surface that is generally parallel with a first surface of the first front edge, the first guide holding slot extending into the first recessed ledge; and the second retaining rail includes a second recessed ledge having a second surface that is generally parallel with a second surface of the second front edge, the second guide holding slot extending into the second recessed ledge.

\* \* \* \* \*